(12) United States Patent
Sagong et al.

(10) Patent No.: US 10,943,900 B2
(45) Date of Patent: Mar. 9, 2021

(54) SEMICONDUCTOR DEVICE AND METHOD FOR FABRICATING THE SAME

(71) Applicant: SAMSUNG ELECTRONICS CO., LTD., Suwon-si (KR)

(72) Inventors: Hyun Chul Sagong, Hwaseong-si (KR); Sang Woo Pae, Seongnam-si (KR); Ki Hyun Choi, Yongin-si (KR); June Kyun Park, Seongnam-si (KR); Uk Jin Jung, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/395,841

(22) Filed: Apr. 26, 2019

(65) Prior Publication Data

US 2020/0035675 A1 Jan. 30, 2020

(30) Foreign Application Priority Data

Jul. 27, 2018 (KR) .......................... 10-2018-0087828

(51) Int. Cl.
| | |
|---|---|
| *H01L 27/088* | (2006.01) |
| *H01L 21/28* | (2006.01) |
| *H01L 29/78* | (2006.01) |
| *H01L 29/66* | (2006.01) |
| *H01L 29/06* | (2006.01) |
| *H01L 21/8234* | (2006.01) |

(52) U.S. Cl.
CPC .... *H01L 27/0886* (2013.01); *H01L 21/28158* (2013.01); *H01L 21/823431* (2013.01); *H01L 29/0649* (2013.01); *H01L 29/66795* (2013.01); *H01L 29/785* (2013.01)

(58) Field of Classification Search
CPC ............ H01L 27/0886; H01L 27/0924; H01L 29/785; H01L 29/66795; H01L 29/78642; H01L 29/7926; H01L 29/66545; H01L 21/823431; H01L 21/823487; H01L 21/823821; H01L 21/823885
See application file for complete search history.

(56) References Cited

U.S. PATENT DOCUMENTS

| | | |
|---|---|---|
| 9,177,805 B2 | 11/2015 | Bouche et al. |
| 9,362,310 B2 | 6/2016 | Adam et al. |
| 9,825,036 B2 | 11/2017 | Lee et al. |
| 2013/0309837 A1 | 11/2013 | Chang et al. |
| 2017/0192050 A1 | 7/2017 | Lei |
| 2018/0090496 A1 | 3/2018 | Cheng et al. |

FOREIGN PATENT DOCUMENTS

| | | |
|---|---|---|
| JP | 2011-166089 | 8/2011 |
| JP | 2013-162076 | 8/2013 |

*Primary Examiner* — Hsien Ming Lee
(74) *Attorney, Agent, or Firm* — F. Chau & Associates, LLC

(57) ABSTRACT

A semiconductor device is provided. The Semiconductor device includes a substrate, a first fin type pattern and a second fin type pattern which protrude from an upper surface of the substrate and are spaced apart from each other, a first semiconductor pattern on the first fin type pattern, a second semiconductor pattern on the second tin type pattern and a blocking pattern between the first semiconductor pattern and the second semiconductor pattern, a part of the first semiconductor pattern being inserted in the blocking pattern.

17 Claims, 22 Drawing Sheets

SEMICONDUCTOR DEVICE AND METHOD FOR FABRICATING THE SAME

CROSS-REFERENCE TO RELATED APPLICATION

This application claims the benefit of Korean Patent Application No. 10-2018-0087828, filed on Jul. 27, 2018, in the Korean Intellectual Property Office, the disclosure of which is incorporated herein in its entirely by reference.

BACKGROUND

1. Field of the Inventive Concept

The present inventive concept relates to a semiconductor device and a method for fabricating the same.

2. Description of the Related Art

Recently, semiconductor devices have been miniaturized and have been improved in performance. Thus, a small structural difference of a transistor included in the semiconductor device greatly a fleets the performance of the semiconductor device.

On the other hand, as the semiconductor device is miniaturized, source/drain regions of adjacent transistors may be short-circuited to each other.

SUMMARY

Aspects of the present inventive concept provide a method for fabricating a semiconductor device capable of improving the yield of the semiconductor device by preventing short-circuit of the source/drain regions of the adjacent transistors without reducing the size of the source/drain of the transistor.

The aspects of the present inventive concept are not restricted to those mentioned above and another aspect which is not mentioned may be clearly understood by those skilled in the art from the description below.

According to some embodiments of the present inventive concept, there is provided a semiconductor device comprising a substrate, a first fin type pattern and a second fin type pattern which protrude from an upper surface of the substrate and are spaced apart from each other, a first semiconductor pattern on the first fin type pattern, a second semiconductor pattern on the second fin type pattern and a blocking pattern between the first semiconductor pattern and the second semiconductor pattern, a part of the first semiconductor pattern being inserted in the blocking pattern.

According to some embodiments of the present inventive concept, there is provided a semiconductor device comprising a first fin type pattern and a second fin type pattern which protrude to extend in a first direction and spaced apart from each other, on a substrate, a first gate structure extending in a second direction different from the first direction on the first fin type pattern; a first semiconductor pattern disposed on at least one side of the first gate structure and disposed on the first fin type pattern, a second gate structure extending in the second direction and spaced apart from the first gate structure on the second fin type pattern, a second semiconductor pattern disposed on at least one side of the second gate structure and disposed on the second fin type pattern and a blocking pattern disposed between the first semiconductor pattern and the second semiconductor pattern and disposed between the first gate structure and the second gate structure, wherein a part of the first semiconductor pattern is inserted into the blocking pattern.

According to some embodiments of the present inventive concept, there is provided a semiconductor device comprising a first transistor including a first gate structure and a first semiconductor pattern disposed on at least one side of the first gate structure, a second transistor including a second gate structure and a second semiconductor pattern disposed on at least one side of the second gate structure and a blocking pattern between the first semiconductor pattern and the second semiconductor pattern, wherein a part of the first semiconductor pattern is inserted into the blocking pattern.

BRIEF DESCRIPTION OP THE DRAWINGS

The above and other aspects and features of the present inventive concept will become more apparent by describing in detail exemplary embodiments thereof with reference to the attached drawings, in which.

DETAILED DESCRIPTION OF THE EMBODIMENTS

Figure 1:
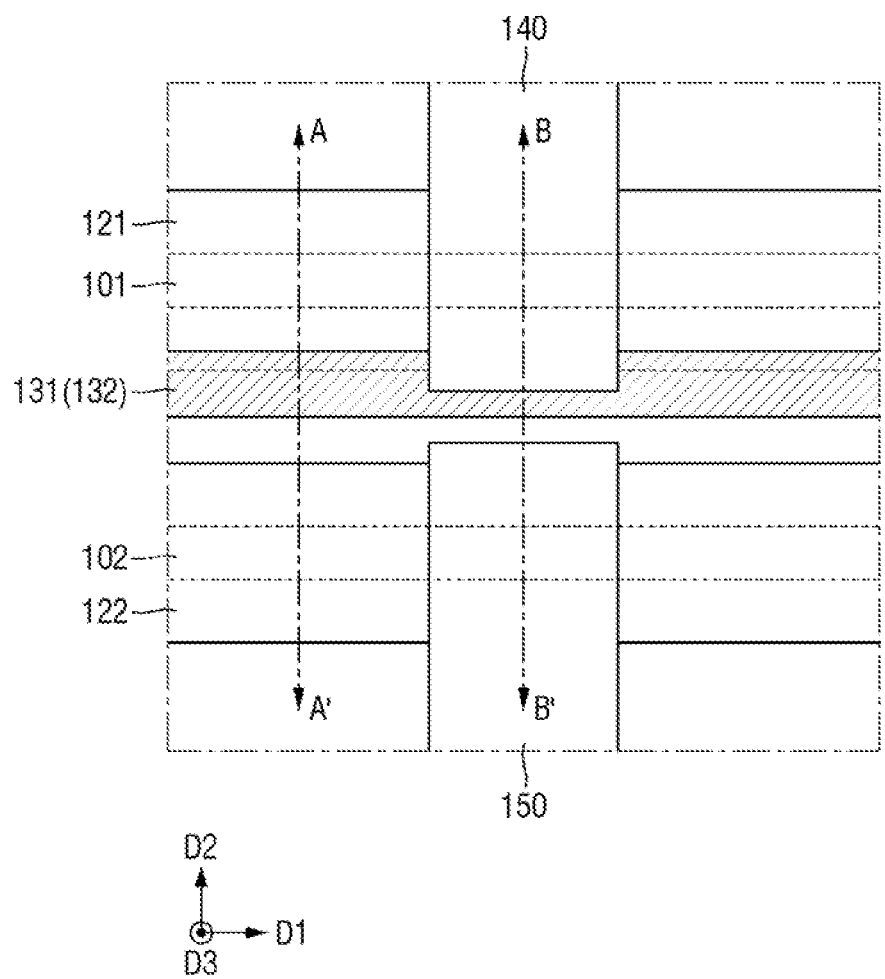
FIG. 1 is a layout diagram of a semiconductor device according to some embodiments of the technical idea of the present inventive concept.

In the drawings of the semiconductor device according, to some embodiments of the present inventive concept, a fin type transistor (FinFET) including a channel region of a fin type pattern shape is exemplarily illustrated, but the present inventive concept is not limited thereto. The semiconductor device according to some embodiments of the present inventive concept may, of course, include a planar transistor, a tunneling transistor (FET), a transistor including a nanowire, a transistor including a nanosheet, or a three-dimensional (3D) transistor. In addition, the semiconductor device according to some embodiments of the present inventive concept may include a bipolar junction transistor, a lateral double diffused transistor (LDMOS), or the like.

Hereinafter, the semiconductor device according to some embodiments of the technical idea of the present inventive concept will be described with reference to FIGS. 1 to 4.

Figure 2:
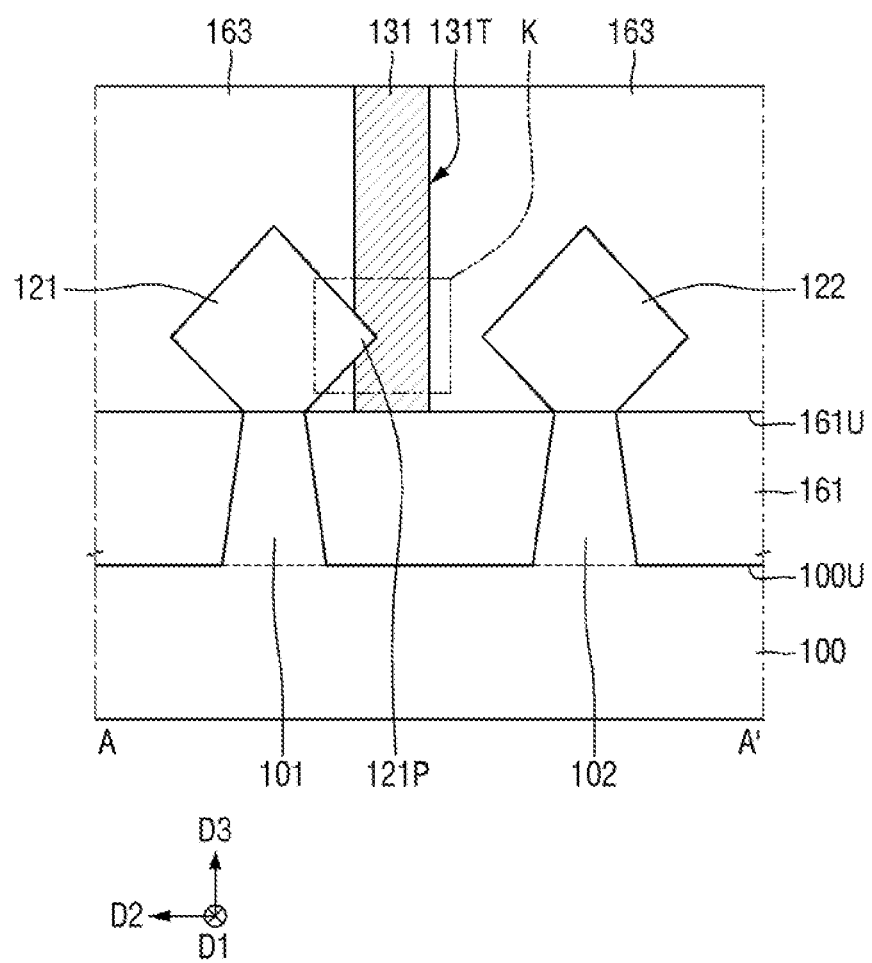
FIG. 2 is a cross-sectional view taken along line A-A' of FIG. 1.
Figure 3:
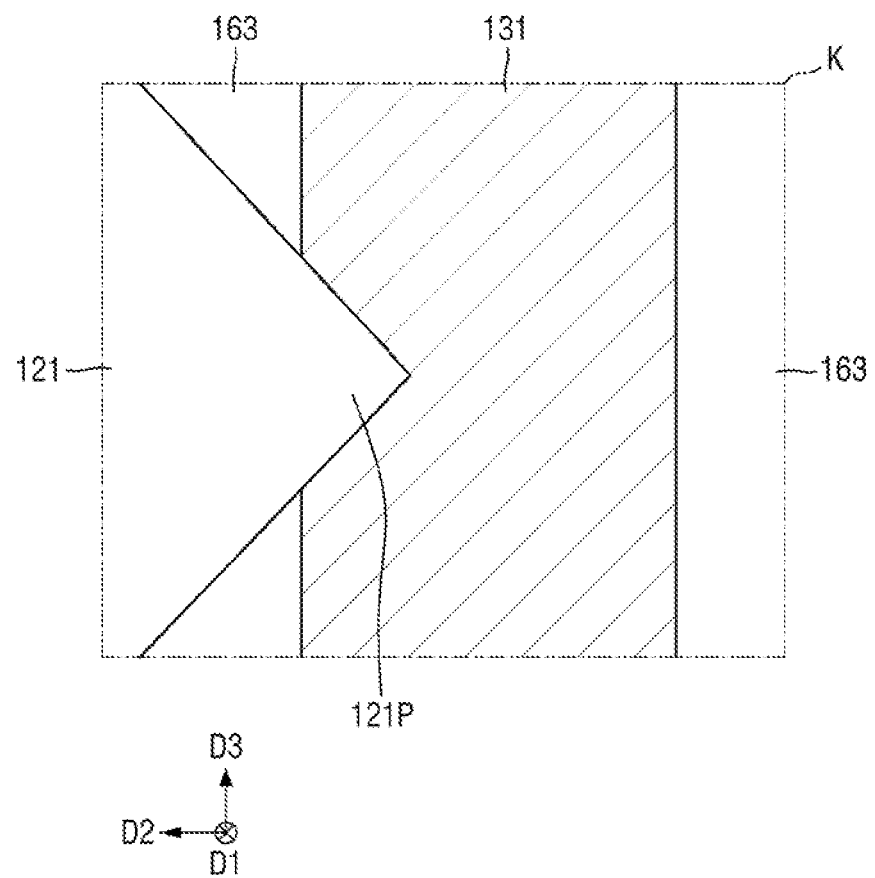
FIG. 3 is an enlarged view of a region K of FIG. 2.
Figure 4:
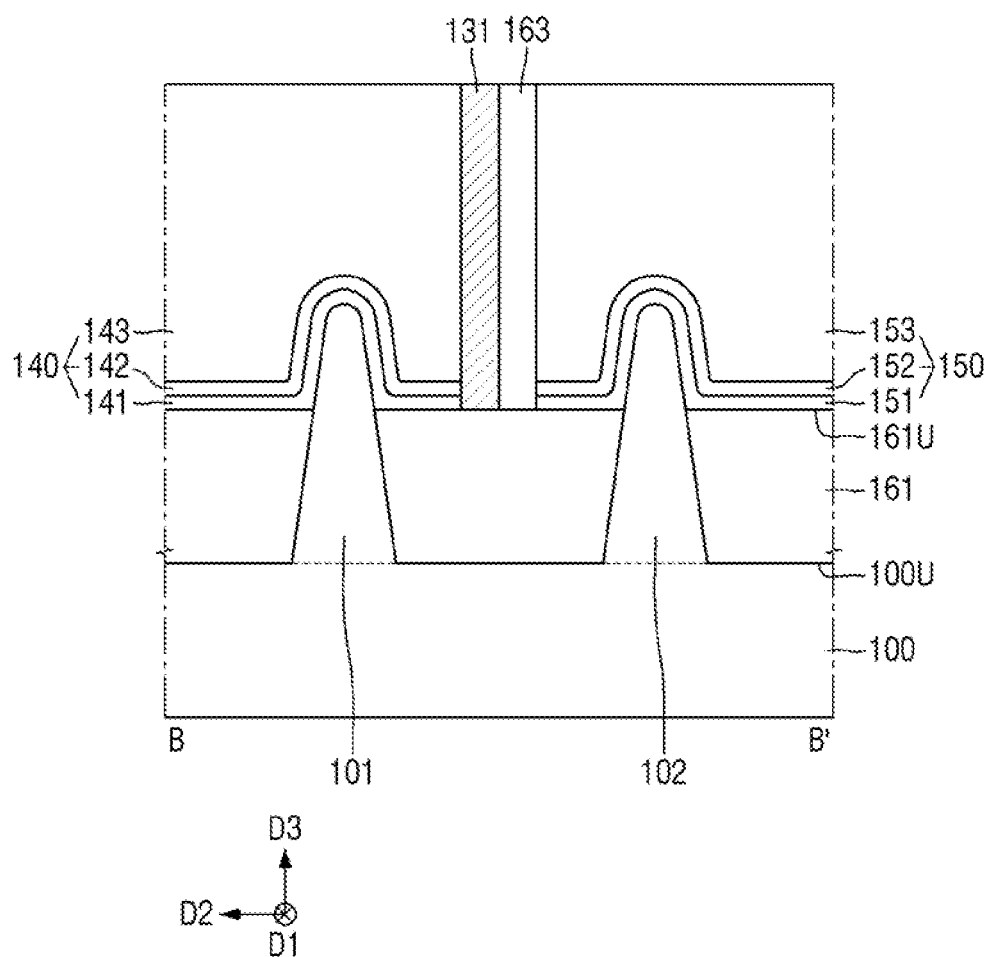
FIG. 4 is a cross-sectional view taken along line B-B' of FIG. 1.

FIG. 1 is a layout diagram of the semiconductor device according to some embodiments of the technical idea of the present inventive concept. In FIG. 1, a field insulating film (161 of FIG. 2) and an interlayer insulating film (163 of FIG. 2) are not illustrated for clarity of the illustration. FIG. 2 is a cross-sectional view taken along line A-A' of FIG. 1. FIG. 3 is an enlarged view of a region K of FIG. 2. FIG. 4 is a cross-sectional view taken along line B-B' of FIG. 1.

Referring to FIGS. 1 to 4, the semiconductor device according to some embodiments of the technical idea of the present inventive concept may include a substrate 100, a field insulating film 163, a first fin type pattern 101, a second tin type pattern 102, a first semiconductor pattern 121, a second semiconductor pattern 122, an interlayer insulating film 163 and a first blocking pattern 131.

The substrate 100 may have a structure in which a base substrate and an epitaxial layer are stacked, but the embodiment is not limited thereto. The substrate 100 may be a silicon substrate, a gallium arsenide substrate, a silicon germanium substrate, a ceramic substrate, a quartz substrate, a display glass substrate, or the like, and may be an SOI (semiconductor on insulator) substrate. Hereinafter, a silicon substrate will be described as an example. Further, the substrate 100 may have a form in which an insulating film is formed on the silicon substrate.

The first fin type pattern 101 and the second fin type pattern 302 may protrude from an upper surface 100U of the substrate 100. The first fin type pattern 101 and the second fin type pattern 102 may extend along a first direction D1. The first fin type pattern 101 and the second fin type pattern 102 may be spaced apart from each other.

An upper surface of a portion of the first fin type pattern 101 on which the first semiconductor pattern 121 is disposed is located substantially on the same plane as an upper surface 161U of the field insulating film 161. An upper surface of a portion of the first fin type pattern 101 on which the first gate structure 140 is disposed may protrude from, for example, the upper surface 161U of the field insulating film 161.

The first fin type pattern 101 and the second fin type pattern 102 may be a part of the substrate 100 and may include an epitaxial layer that is grown from the substrate 100. Each of the first fin type pattern 101 and the second fin type pattern 102 may include, for example, silicon or germanium which is an elemental semiconductor material. Further, each of the first fin type pattern 101 and the second fin type pattern 102 may include a compound semiconductor, and may include, for example, a group IV-IV compound semiconductor or a group III-V compound semiconductor.

Specifically, taking the IV-IV group compound semiconductor as an example, each of the first fin type pattern 101 and the second fin type pattern 102 may be a binary compound or a ternary compound containing at least two of carbon (C), silicon (Si), germanium (Ge) and tin (Sn), or a compound obtained by doping these elements with a group IV element. Taking the group III-V compound semiconductor as an example, each of the first fin type pattern 101 and the second fin type pattern 102 may be one of a binary compound, a ternary compound or a quaternary compound formed of bonding at least one of aluminum (Al), gallium (Ga) and indium (In) as a group III element and at least one of phosphorus (P), arsenic (As) and antimony (Sb) as a group V element.

In the drawings, the respective side surfaces of the first fin type pattern 101 and the second fin type pattern 102 is illustrated as having an arbitrary inclination from the upper surface 100U of the substrate 100, but the technical idea of the inventive concept is not limited thereto. For example, it is a matter of course that the side surfaces of each of the first fin type pattern 101 and the second fin type pattern 102 may be perpendicular to the upper surface 100U of the substrate 100 depending on the process.

The field insulating film 161 may be disposed on the substrate 100. The field insulating film 161 may wrap at least a part of each of the first tin type pattern 101 and the second fin type pattern 102.

The field insulating film 161 may include, for example, a material including at least one of a silicon oxide film, a silicon nitride film, and a silicon oxynitride film.

The first gate structure 140 may be disposed on the first fin type pattern 101 to intersect the first fin type pattern 101. The first gate structure 140 may extend along a second direction D2. The second direction D2 may be a direction different from the first direction D1. The second gate structure 150 may be disposed on the second fin type pattern 102 to intersect the second fin type pattern 102. The second gate structure 150 may extend along the second direction D2. The first gate structure 140 and the second gate structure 150 may be spaced apart from each other.

In some embodiments, the first gate structure 140 and the second fin type pattern 102 may not overlap each other. Also, the second gate structure 150 and the first fin type pattern 101 may not overlap each other.

The first gate structure 140 may include first gate insulating films 141 and 142 and a first gate electrode 143. The second gate structure 150 may include second gate insulating films 151 and 152 and a second gate electrode 153.

The first gate insulating films 141 and 142 may extend along the upper surface 161U of the field insulating film 161 and a portion of the first fin type pattern 101 protruding from the upper surface 161U of the field insulating film 161. The second gate insulating films 151 and 152 may extend along the upper surface 161U of the field insulating film 161 and a portion of the second fin type pattern 102 protruding from the upper surface 161U of the field insulating film 161.

The first gate insulating films 141 and 142 may include, for example, a first interfacial layer 141 and a first high dielectric constant insulating film 142. The second gate insulating films 151 and 152 may include, for example, a second interface film 151 and a second high dielectric constant insulating film 152.

The first interface film 141 and the second interface film 151 may include, but are not limited to, for example, silicon oxide. That is, the first interface film 141 and the second interface film 151 may, of course, contain other materials, depending on the type of the substrate 100, the type of the first high dielectric constant insulating film 142 and the second high dielectric constant insulating film 152 and the like.

The first high dielectric constant insulating film 142 may be disposed on the first interface film 141. Further, the second high dielectric constant insulating film 152 may be disposed on the second interlace film 151. The first high dielectric constant insulating film 142 and the second high dielectric constant insulating film 152 may include one or more of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide or lead zinc niobate.

Further, the first high dielectric constant insulating film 142 and the second high dielectric constant insulating film 152 have been described focusing on oxides. Alternatively, the first high dielectric constant insulating film 142 and the second high dielectric constant insulating film 152 may include, but is not limited to, one or more of a nitride (for example, hafnium nitride) or oxynitride (for example, hafnium oxynitride) of the above-described metal material.

The first gate electrode 143 may be disposed on the first gate insulating films 141 and 142. The second gate electrode 153 may be disposed on the second gate insulating films 151 and 152. The first gate electrode 143 and the second gate electrode 153 may include at least one or more metal layer.

The first semiconductor pattern 121 may be disposed on the first fin type pattern 101. The first semiconductor pattern 121 may be disposed on the upper surface 161U of the field insulating film 161. The first semiconductor pattern 121 may be disposed on at least one side of the first gate structure 140.

The second semiconductor pattern 122 may be disposed on the second fin type pattern 102. The second semiconductor pattern 122 may be disposed on the upper surface 161U of the field insulating film 161. The second semiconductor pattern 122 may be disposed on at least one side of the second gate structure 150.

The first semiconductor pattern 121 and the second semiconductor pattern 122 may be the source/drains of different transistors, and may be, for example, elevated source/drains.

The first gate structure 140 and the first semiconductor pattern 121 may form a first transistor. The second gate structure 150 and the second semiconductor pattern 122 may form a second transistor. In some embodiments, the first transistor and the second transistor may be the same type of transistors or different types of transistors.

When the first transistor and/or the second transistor is a PMOS transistor, the first semiconductor pattern 121 and/or the second semiconductor pattern 122 may include compressive stress materials. For example, the compressive stress material may be a material having a lattice constant greater than Si, and may be, for example, SiGe. The compressive stress material may apply a compressive stress to the first semiconductor pattern 121 and/or the second semiconductor pattern 122 to improve the mobility of carriers of a channel region.

When the first transistor and/or the second transistor is an NMOS transistor, the first semiconductor pattern 121 and/or the second semiconductor pattern 122 may be the same material as the substrate 100 or a tensile stress material. For example, when the substrate 100 is Si, the first semiconductor pattern 121 and/or the second semiconductor pattern 122 may be Si or a material having a lattice constant smaller than Si (e.g., SiC).

The first semiconductor pattern 121 and the second semiconductor pattern 122 may have at least one of a diamond shape, a circular shape and a rectangular shape. Although the diamond shape (or a pentagonal shapes or a hexagonal shape) is illustrated in the drawings as an example, the technical idea of the present inventive concept is not limited thereto.

The interlayer insulating film 163 may be disposed on the upper surface 161U of the field insulating film 161. The interlayer insulating film 163 may wrap and cover the first semiconductor pattern 121 and the second semiconductor pattern 122. The interlayer insulating film 163 may be disposed between the second gate structure 150 and the first blocking pattern 131. The interlayer insulating film 163 may wrap, for example, the side surface of the first gate structure 140 and the side surface of the second gate structure 150. For example, the interlayer insulating film 163 may expose the upper surface of the first gate structure 140 and the upper surface of the second gate structure 150.

The interlayer insulating film 163 may include a first trench 131T. The first trench 131T may expose a first portion 121P of the first semiconductor pattern 121. In some embodiments, the first trench 131T may expose the upper surface 161U of the field insulating film 161. The first trench 131T may be formed in the interlayer insulating film 163 to extend in the first direction D1. In some embodiments, the first trench 131T may expose a part of the first gate structure 140.

The first blocking pattern 131 may be disposed in the first trench 131T. In other words, the first blocking pattern 131 may be disposed in the interlayer insulating film 163. The first blocking pattern 131 may be disposed between the first semiconductor patient 121 and the second semiconductor pattern 122.

In some embodiments, the first blocking pattern 131 may be disposed between the first gate structure 140 and the second gate structure 150. In this case, for example, the first blocking pattern 131 may extend along the first direction D1, for example, between the first semiconductor pattern 121 and the second semiconductor pattern 122 and between the first gate structure 140 and the second gate structure 150.

A width of a portion of the first blocking pattern 131 disposed between the first gate structure 140 and the second gate structure 150 may be smaller than a width of a portion of the first blocking pattern 131 disposed between the first semiconductor pattern 121 and the second semiconductor pattern 122. Here, the width may be ae value measured along the second direction D2.

In some embodiments, the first blocking pattern 131 may extend along the third direction D3, for example, from the upper surface of the interlayer insulating film 163 to the upper surface 161U of the field insulating film. For example, the first blocking pattern 131 may be in contact with the upper surface 161U of the field insulating film 161.

The third direction D3 may be a direction intersecting the first direction D1 and the second direction D2. The third direction D3 may be, for example, a direction perpendicular to the upper surface 161U or the field insulating film 161.

In some embodiments, the first blocking pattern 131 may be spaced apart from the second gate structure 150. A part of the interlayer insulating film 163 may be disposed between the first blocking pattern 131 and the second gate structure 150.

The first portion 121P of the first semiconductor pattern 121 may be inserted into the first blocking pattern 131. In other words, the first portion 121P of the first semiconductor pattern 121 may overlap the first blocking pattern 131 in the third direction D3. A part of the first blocking pattern 131 may be disposed on the first semiconductor pattern 121.

In the semiconductor device according to some embodiments of the technical idea of the present inventive concept, by disposing the first blocking pattern 131 between the first semiconductor pattern 121 and the second semiconductor pattern 122, without reducing the size of the first semiconductor pattern 121, it is possible to prevent a short circuit between the first semiconductor pattern 121 and the second semiconductor pattern 122. In other words, since the first portion 121P of the first semiconductor pattern 121 is inserted into the first blocking pattern 131, the size of the first semiconductor pattern 121 may not be reduced. Therefore, it is possible to prevent the short circuit between the first semiconductor pattern 121 and the second semiconductor pattern 122 while maintaining the performance of the semiconductor device, thereby improving the yield of the semiconductor device.

A part of the first gate structure 140 may be inserted into the first blocking pattern 131. In other words, a part of the first gate structure 140 may overlap the first blocking pattern 131 in the second direction D2. The first blocking pattern 131 may insulate the first gate structure 140 from the second gate structure 150, for example, together with the interlayer insulating film 163.

The first blocking pattern 131 may include, for example, one of SiN and SiOCN. However, the technical idea of the present inventive concept is not limited thereto. For example, the first blocking pattern 131 may be a material that may insulate the first semiconductor pattern 121 from the second semiconductor pattern 122 and has a tolerance to the etching process.

Hereinafter, the semiconductor device according to some embodiments of the technical idea of the present inventive concept will be described with reference to FIGS. 1, 5, 6, and 7. For the sake of clarity of explanation, repealed parts of the aforementioned description will be omitted or simplified.

Figure 5:
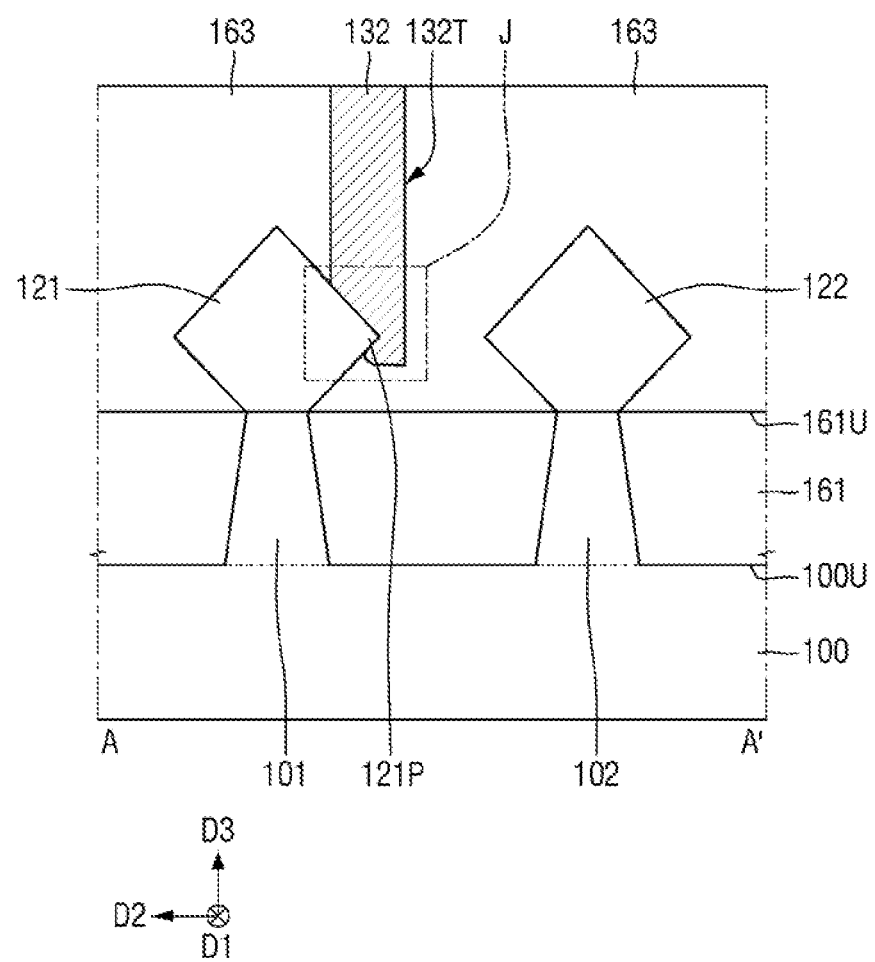
FIG. 5 is a cross-sectional view taken along line A-A' of FIG. 1.
Figure 6:
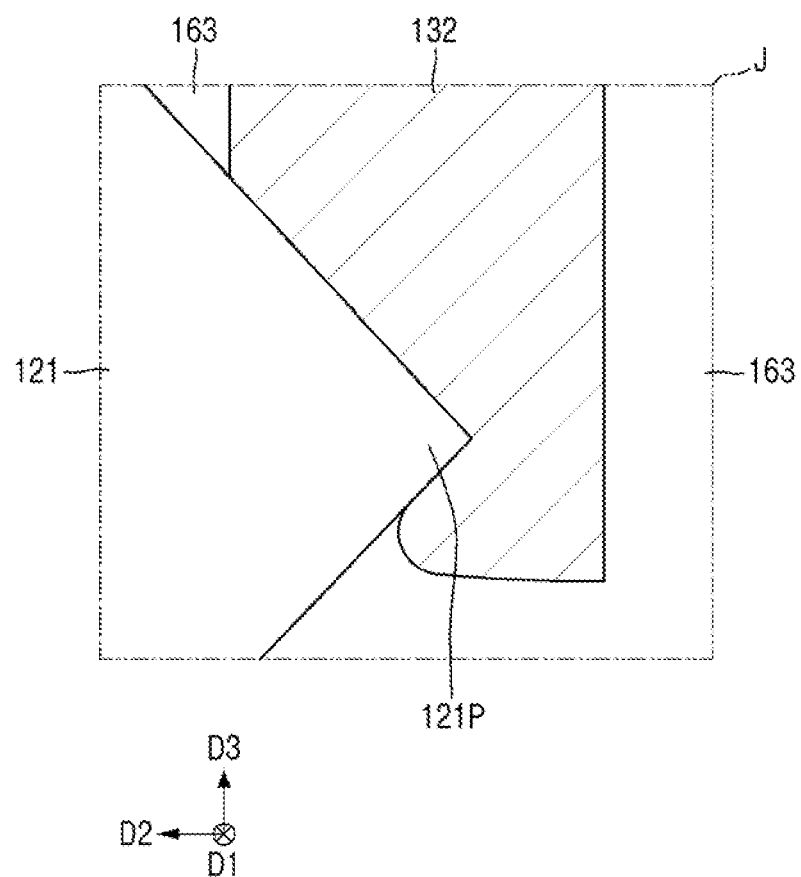
FIG. 6 is an enlarged view of a region J of FIG. 5.
Figure 7:
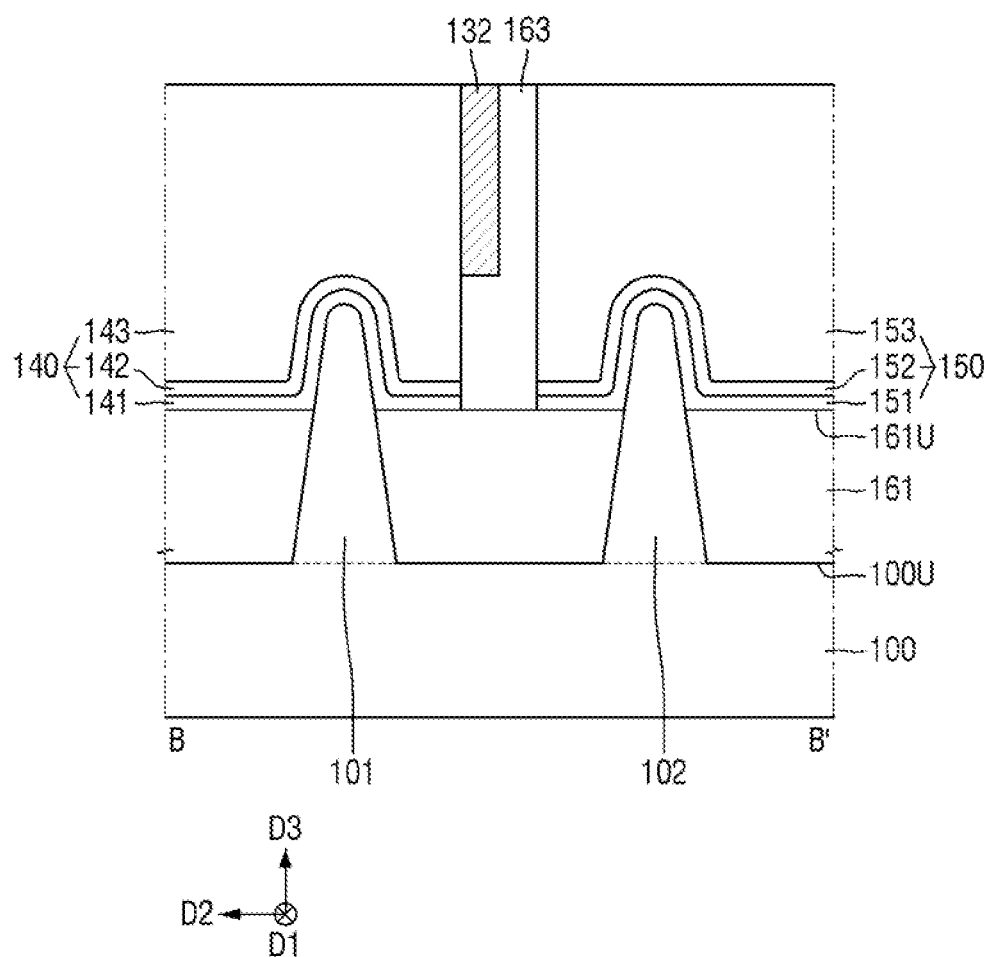
FIG. 7 is a cross-sectional view taken along line B-B' of FIG. 1.

FIG. 5 is a cross-sectional view taken along line A-A' of FIG. 1. FIG. 6 is an enlarged view of a region J of FIG. 5. FIG. 7 is a cross-sectional view taken along line B-B' of FIG. 1.

Referring to FIGS. 1, 5, 6, and 7, the interlayer insulating film 163 of the semiconductor device according to some embodiments of the technical idea of the present inventive concept may include a second trench 132T.

The second trench 132T may expose the first portion 121P of the first semiconductor pattern 121. In some embodiments, the second trench 132T may not expose the upper surface 161U of the field insulating film 161. The second trench 132T may be formed in the interlayer insulating film 163 to extend in the first direction D1. In some embodiments, the second trench 132T may expose a part of the first gate structure 140.

The second blocking pattern 132 may be disposed in the second trench 132T. The second blocking pattern 132 may be disposed between the first semiconductor pattern 121 and the second semiconductor pattern 122. The second blocking pattern 132 may be disposed on the first semiconductor pattern 121 between the first semiconductor pattern 121 and the second semiconductor pattern 122. In other words, the second blocking pattern 132 may have a portion disposed between the first semiconductor pattern 121 and the second semiconductor pattern 122, while being disposed on the first semiconductor pattern 121.

In some embodiments, the second blocking pattern 132 may be disposed between the first gate structure 140 and the second gate structure 150. In this case, the second blocking pattern 132 may extended along the first direction D1, for example, between the first semiconductor pattern 121 and the second semiconductor pattern 122, and between the first gate structure 140 and the second gate structure 150.

In some embodiments, the second blocking pattern 132 may be spaced apart from the second gate structure 150. A part of the interlayer insulating film 163 may be disposed between the second blocking pattern 132 and the second gate structure 150.

In some embodiments, for example, the second blocking pattern 132 may extend to a part of the interlayer insulating film 163 from the upper surface of the interlayer insulating film 163 along the third direction D3 inside interlayer insulating film 163. In other words, the second blocking pattern 132 may be disposed to be spaced apart from the upper surface 161U of the field insulating film 161.

The first portion 121P of the first semiconductor pattern 121 may be inserted into the second blocking pattern 132. In other words, the first portion 121P of the first semiconductor pattern 121 may overlap the second blocking pattern 132 in the third direction D3.

In the semiconductor device according to some embodiments of the technical idea of the present inventive concept, in a case where an aspect ratio is high when forming the second trench 132T in the interlayer insulating film 163, by preventing the second blocking pattern 132 from extending to the upper surface 161U of the field insulating film 161 while being disposed between the first semiconductor pattern 121 and the second semiconductor pattern 122, it is possible to overcome limitation according to a higher aspect ratio.

A part of the first gate structure 140 may be inserted into the second blocking pattern 132. In other words, a part of the first gate structure 140 may overlap the second blocking pattern 132 in the second direction D2. The second blocking pattern 132 may insulate the first gate structure 140 from the second gate structure 150, for example, together with the interlayer insulating film 163.

The second blocking pattern 132 may include, for example, one of SiN and SiOCN. However, the technical idea of the present inventive concept is not limited thereto. For example, the second blocking pattern 132 may be a material that may insulate the first semiconductor pattern 121 from the second semiconductor pattern 122 and has a tolerance to the etching process.

Hereinafter, a semiconductor device according to some embodiments of the technical idea of the present inventive concept will be described with reference to FIGS. 2, 8, and 9. For the sake of clarity of explanation, repeated parts of the aforementioned description will be omitted or simplified.

Figure 8:
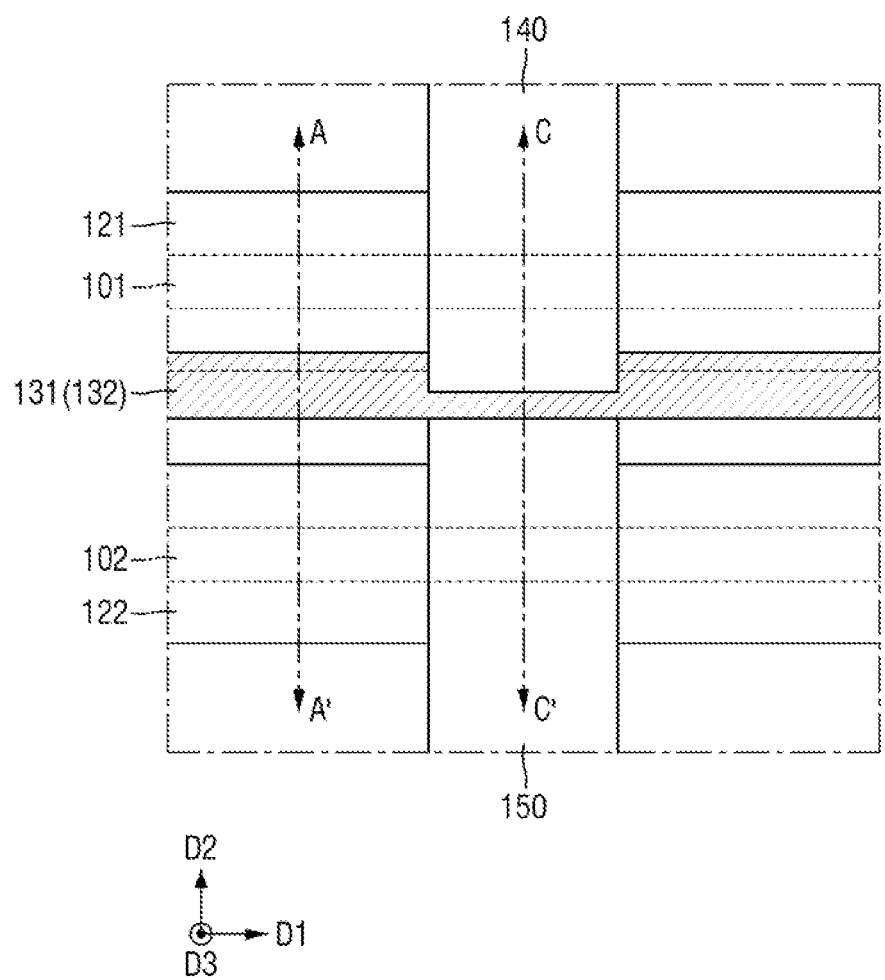
FIG. 8 is a layout diagram of the semiconductor device according to some embodiments of the technical idea of the present inventive concept.

FIG. 8 is a layout diagram of a semiconductor device according to some embodiments of the technical idea of the present inventive concept. In FIG. 8, the field insulating film (161 of FIG. 2) and the interlayer insulating film (163 of FIG. 2) are not illustrated for clarity of the illustration. The cross-sectional view taken along line A-A' of FIG. 8 may be the same as FIG. 2.

Figure 9:
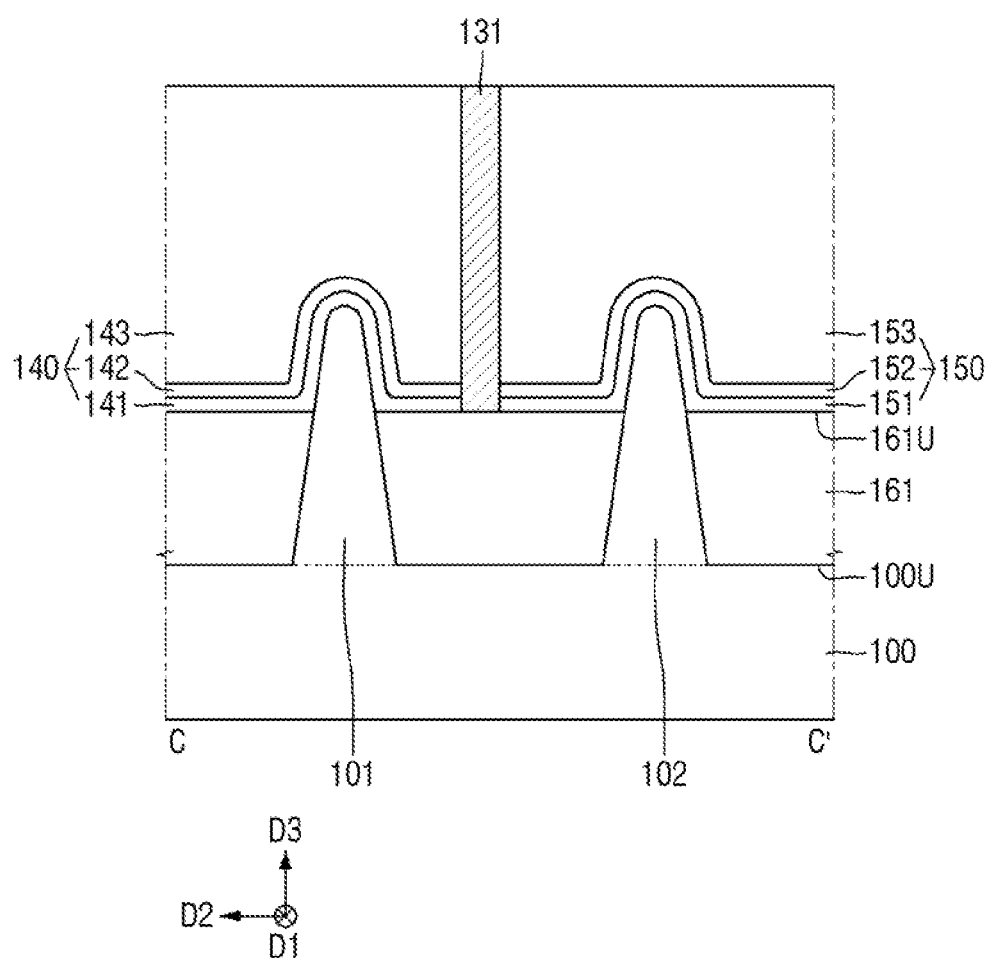
FIG. 9 is a cross-sectional view taken along line C-C' of FIG. 8.

FIG. 9 is a cross-sectional view taken along line C-C' of FIG. 8.

Referring to FIGS. 2, 8, and 9, the first blocking pattern 131 of the semiconductor device according to some embodiments of the technical idea of the present inventive concept may be in contact with the second gate structure 150.

The first blocking pattern 131 may separate the first gate structure 140 and the second gate structure 150, between the first gate structure 140 and the second gate structure 150. For example, in an intermediate stage of the fabricating process of the semiconductor device, the first gate structure 140 and the second gate structure 150 may be a single gate structure connected to each other. As the first blocking pattern 131 is disposed in a single gate structure in a subsequent process, the single gate structures may be dived into the first gate structure 140 and the second gate structure 150.

The first gate structure 140 and the first semiconductor pattern 121 may form a first transistor. The second gate structure 150 and the second semiconductor pattern 122 may form a second transistor. In some embodiments, the first transistor and the second transistor may be the same type of transistors or may be different types of transistors.

Hereinafter, the semiconductor device according to some embodiments of the technical idea of the present inventive concept will be described with reference to FIGS. 5, 8 and 10. For the sake of clarity of explanation, repeated parts of the aforementioned description will be omitted or simplified.

Figure 10:
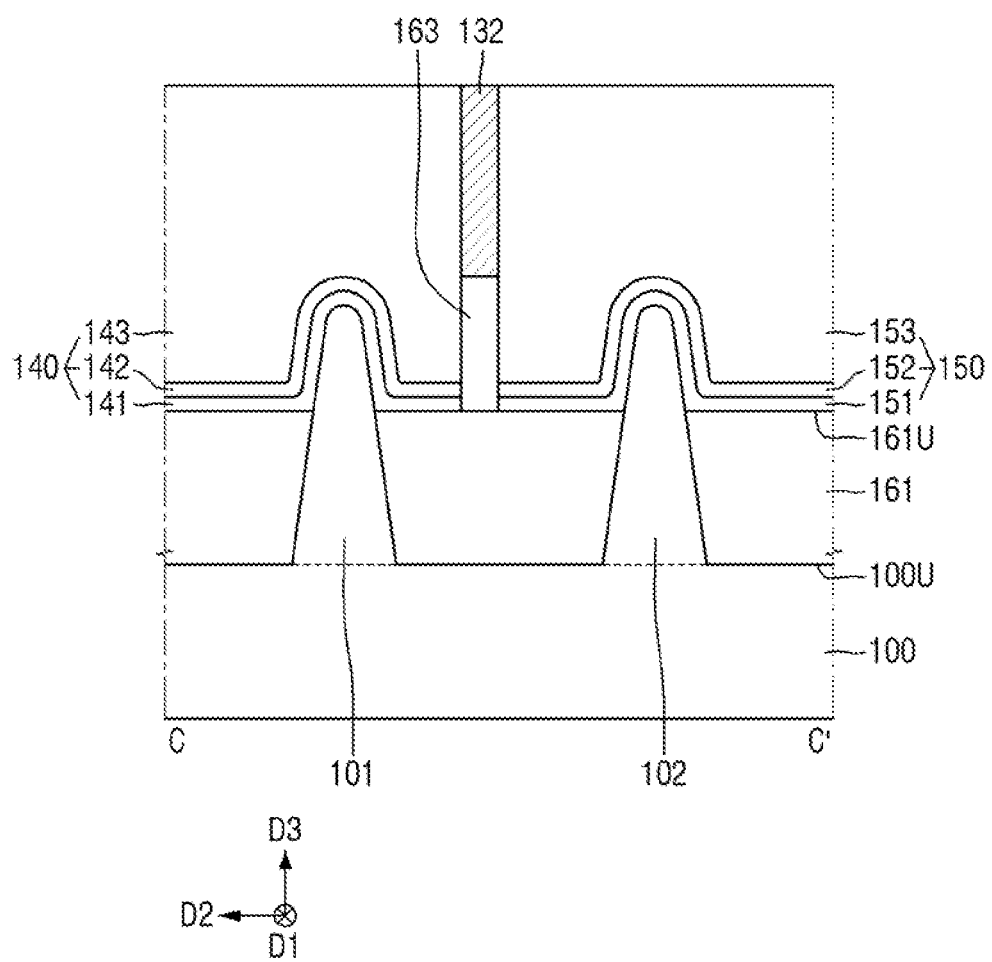
FIG. 10 is a cross-sectional view taken along the line C-C' of FIG. 8.

FIG. 10 is a cross-sectional view taken along the line C-C' of FIG. 8. The cross-sectional view taken along line A-A' of FIG. 8 may be the same as FIG. 5.

Referring to FIGS. 5, 8 and 10, the second blocking pattern 132 of the semiconductor device according to some embodiments of the technical idea of the present inventive concept may be in contact with the second gate structure 150.

The second blocking pattern 132 may separate the first gate structure 140 and the second gate structure 150, between the first gate structure 140 and the second gate structure 150. An interlayer insulating film 163 may be disposed between the second blocking pattern 132 and the upper surface 161U of the field insulating film 161.

Hereinafter, the semiconductor device according to some embodiments of the technical idea of the present inventive concept will be described with reference to FIGS. 2, 5, 11, and 12. For the sake of clarity of explanation, repeated parts of the aforementioned description will be omitted or simplified.

Figure 11:
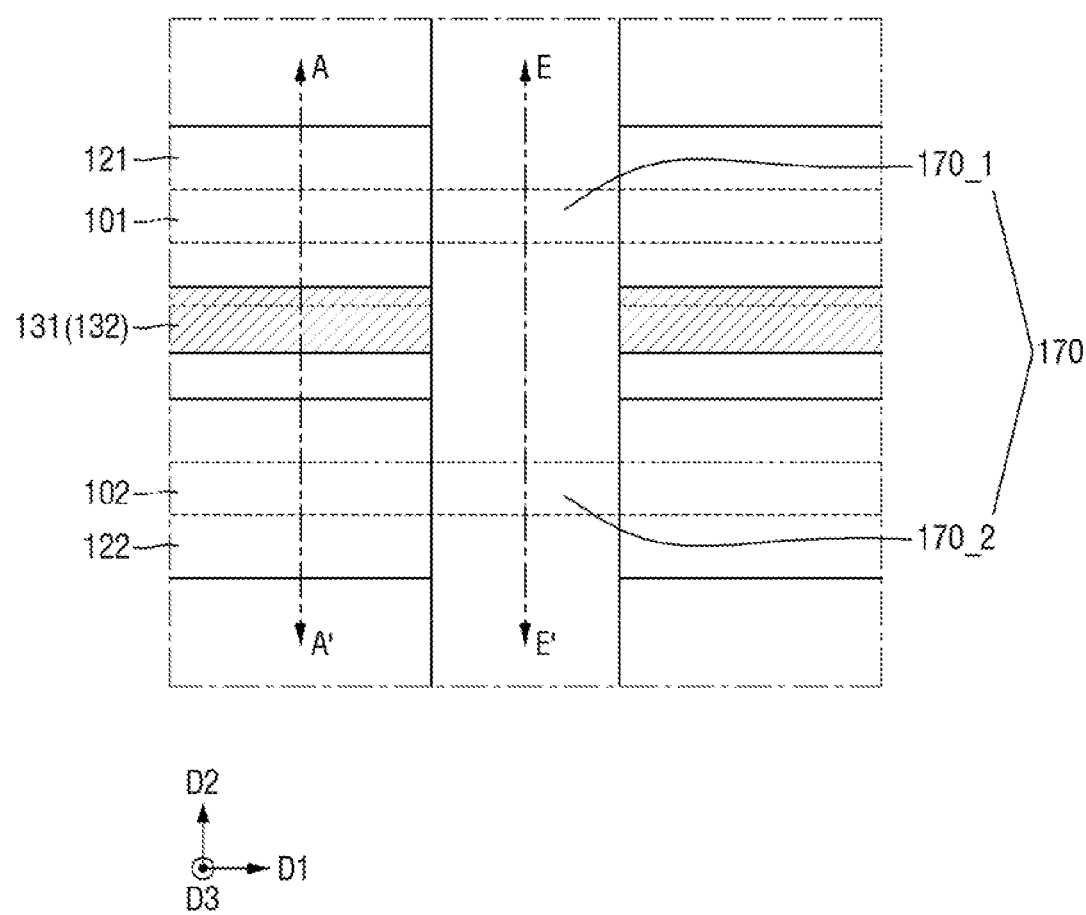
FIG. 11 is a layout diagram of the semiconductor device according to some embodiments of the technical idea of the present inventive concept.

FIG. 11 is a layout diagram of the semiconductor device according to some embodiments of the technical idea of the present inventive concept. In FIG. 11, the field insulating film (161 of FIG. 2) and the interlayer insulating film (163 of FIG. 2) are not illustrated for clarity of the illustration. The cross-sectional view taken along line A-A' of FIG. 11 may be any one of FIGS. 2 and 5.

Figure 12:
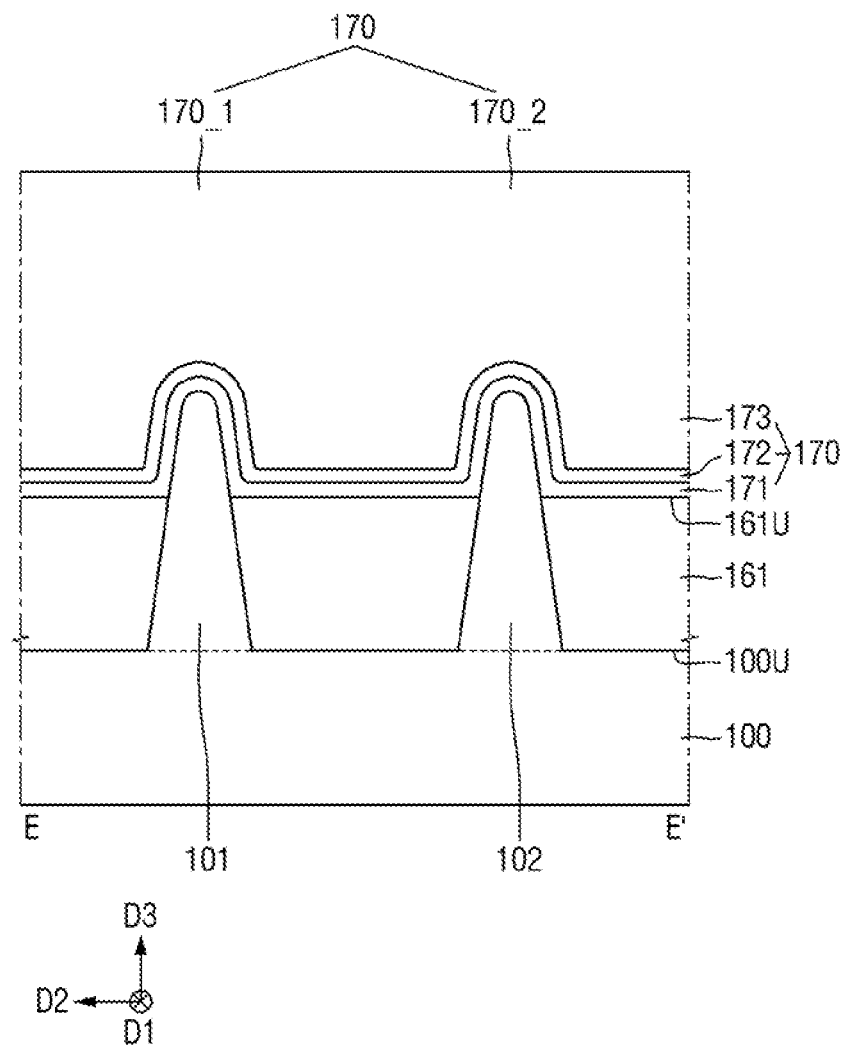
FIG. 12 is a cross-sectional view taken along line E-E' of FIG. 11.

FIG. 12 is a cross-sectional view taken along line E-E' of FIG. 11.

Referring to FIGS. 2, 5, 11, and 12, a semiconductor device according to some embodiments of the technical idea of the present inventive concept may include a third gate structure 170.

The third gate structure 170 may be disposed on the first fin type pattern 101 and the second fin type pattern 102 to intersect the first fin type pattern 101 and the second fin type pattern 102. The third gate structure 170 may extend along the second direction D2.

The third gate structure 170 may include a first part 170_1 and a second part 170_2. The first portion 170_1 of the third gate structure 170 may be a portion that overlaps the first fin type pattern 101 in the third direction D3. The second part 170_2 of the third gate structure 170 may be a portion that overlaps the second fin type pattern 102 in the third direction D3.

The third gate structure 170 may include third gate insulating films 171 and 172 and a third gate electrode 173. The third gate insulating films 171 and 172 may extend along the upper surface 161U of the field insulating film 161, the portion of the first fin type pattern 101 protruding from the upper surface 161U of the field insulating film 161, and the portion of the second fin type pattern 102 protruding from the upper surface 161U of the field insulating film 161.

The third gate insulating films 171 and 172 may include, for example, a third interface film 171 and a third high dielectric constant insulating film 172. The description of the first and second interface films 141 and 151 may also be applied to the third interface film 171. The description of the first and second high dielectric constant insulating films 142 and 152 may also be applied to the third high dielectric constant insulating film 172.

The third gate electrode 173 may be disposed on the third gate insulating film 171 and 172. The description of the first and second gate electrodes 143 and 153 may also be applied to the third gate electrode 173.

The first semiconductor pattern 121 and the second semiconductor patient 122 may be disposed on at least one side of the third gate structure 170.

The first blocking pattern 131 or the second blocking pattern 132 may be disposed on at least one side of the third gate structure 170. The first blocking pattern 131 or the second blocking pattern 132 may be disposed between the first semiconductor pattern 121 and the second semiconductor pattern 122. The first blocking pattern 131 or the second blocking pattern 132 may not extend in the first direction D1, for example, across the third gate structure 170.

The first portion 170_1 of the third gate structure 170 and the first semiconductor pattern 121 may form a third transistor. The second portion 170_2 of the third gate structure 170 and the second semiconductor pattern 122 may form a fourth transistor. In some embodiments, the third transistor and the fourth transistor may be the same type of transistors or may be different types of transistors.

In the semiconductor device according to some embodiments of the technical idea of the present inventive concept, when it is intended to form the same type or different types of separate transistors using one continuous gate structure, by using the first blocking pattern 131 and the second blocking pattern 132, it is possible to a short circuit phenomenon between the semiconductor patterns of separate transistors.

Hereinafter, a method for fabricating a semiconductor device according to some embodiments of the technical idea of the present inventive concept will be described with reference to FIGS. 13 to 17. For the sake of clarity of explanation, repeated parts of the aforementioned description will be omitted or simplified.

FIGS. 13 to 17 are intermediate step diagrams for explaining the method for fabricating the semiconductor device according to some embodiments of the technical idea of the present inventive concept.

Figure 13:
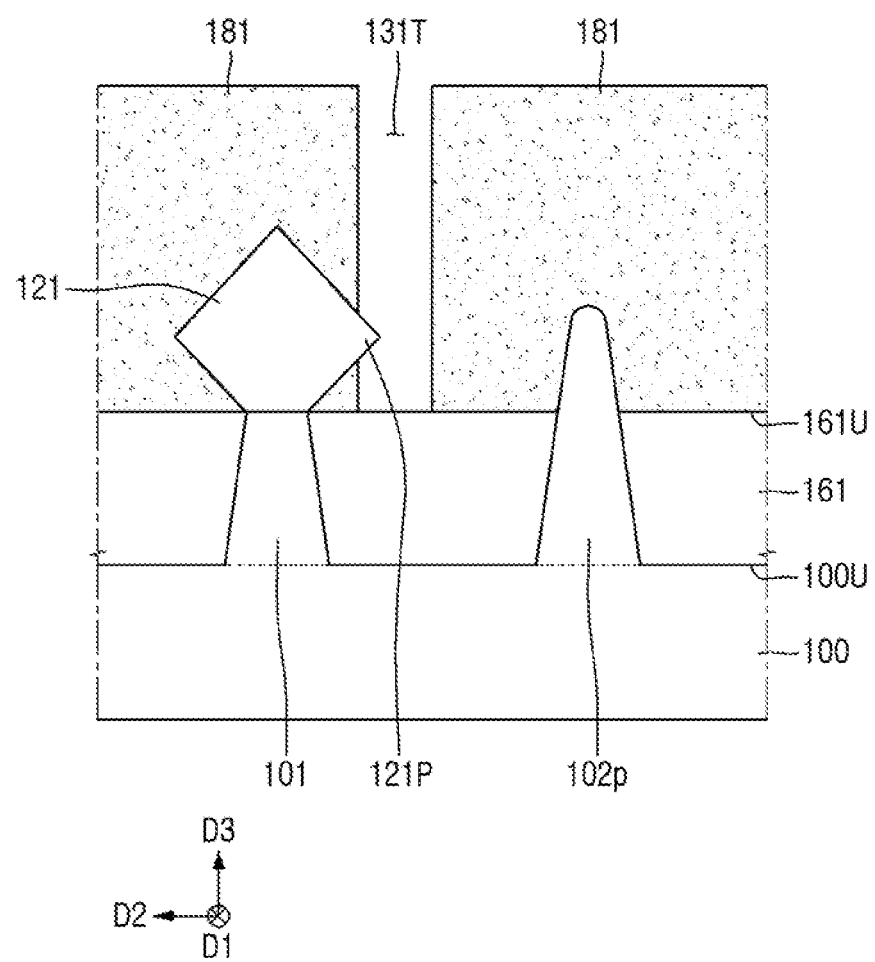
FIGS. 13 to 17 are intermediate step diagrams for explaining a method for fabricating a semiconductor device according to some embodiments of the technical idea of the present inventive concept.

Referring to FIG. 13, a substrate 100 on which a first fin type pattern 101, a second tree fin type pattern 102p, a field insulating film 161 and a first semiconductor pattern 121 are formed may be provided.

The second free fin type pattern 102p may include a portion protruding from the upper surface 161U of the field insulating film 161. The second free fin type pattern 102p may be a second fin type pattern 102 before the second semiconductor pattern 122 is formed.

A first mask layer 181 may be formed on the substrate 100. The first mask layer 181 may cover the second free fin type pattern 102p, the first semiconductor pattern 121, and the upper surface 161U of the field insulating film 161.

By removing a part of the first mask layer 181, a first trench 131T may be formed. That is, the first trench 131T may be formed in the first mask layer 181. The first trench 131T may expose a first portion 121P of the first semiconductor pattern 121. The first trench 131T may expose the upper surface 161U of the field insulating film 161.

Figure 14:
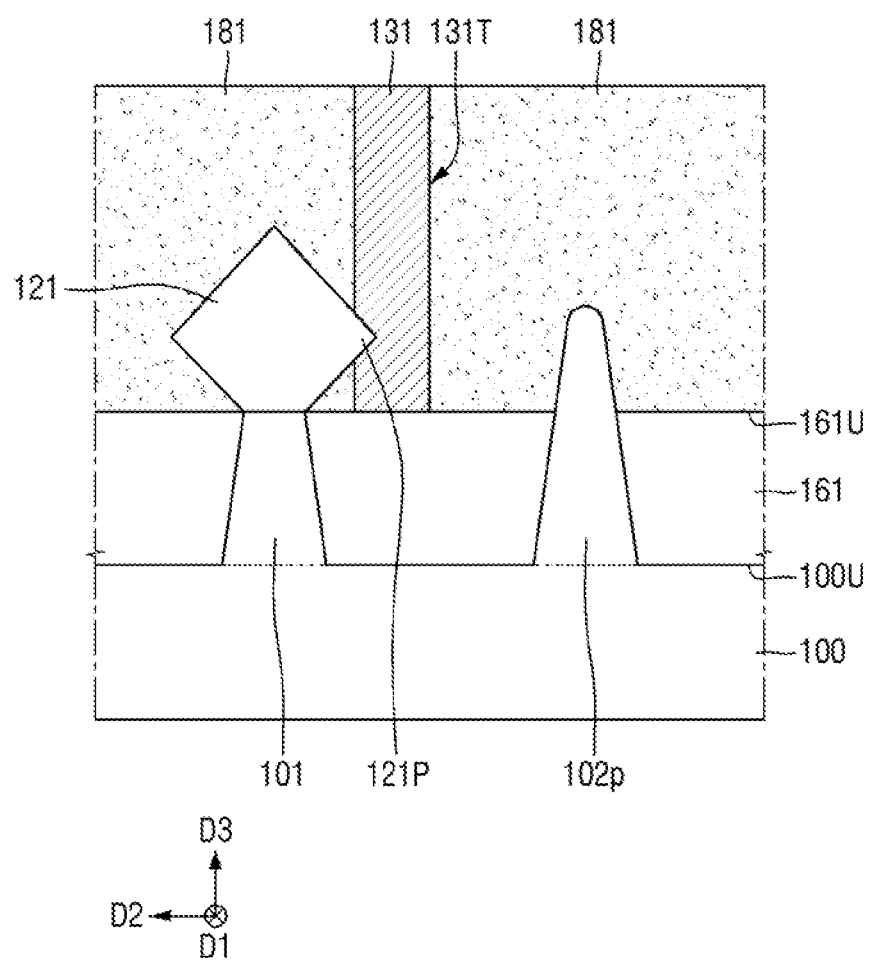

Referring to FIG. 14, the first blocking pattern 131 may be formed by filling the first trench 131T with a blocking pattern material. The blocking pattern material may wrap the first portion 121P of the first semiconductor pattern 121 exposed by the first trench 131T. As a result, the first portion 121P of the first semiconductor pattern 121 is inserted into the first blocking pattern 131 and may overlap the first blocking pattern 131 in the third direction D3.

In the fabricating process of the semiconductor device according to some embodiments of the technical idea of the present inventive concept, after forming the first semiconductor pattern 121, by forming the first blocking pattern 131 before forming the second semiconductor pattern 122, it is possible to short-circuit between the first semiconductor pattern 121 and the second semiconductor pattern 122 without decreasing the size of the first semiconductor pattern 121.

Figure 15:
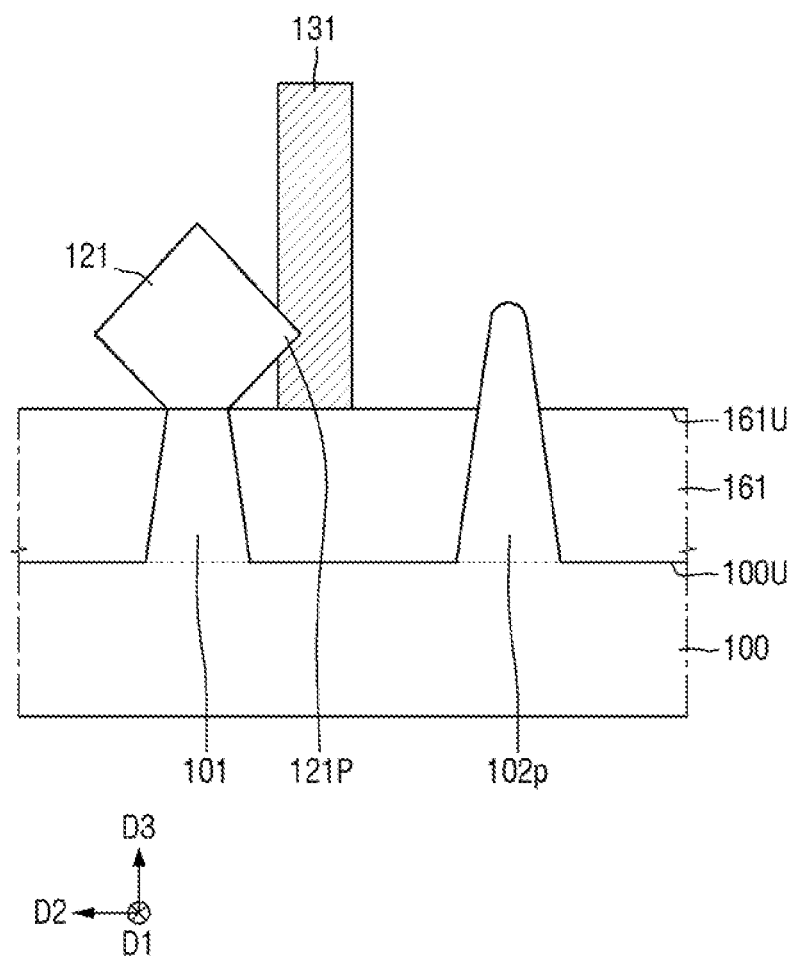

Referring to FIG. 15, the first mask layer 181 may be removed.

Figure 16:
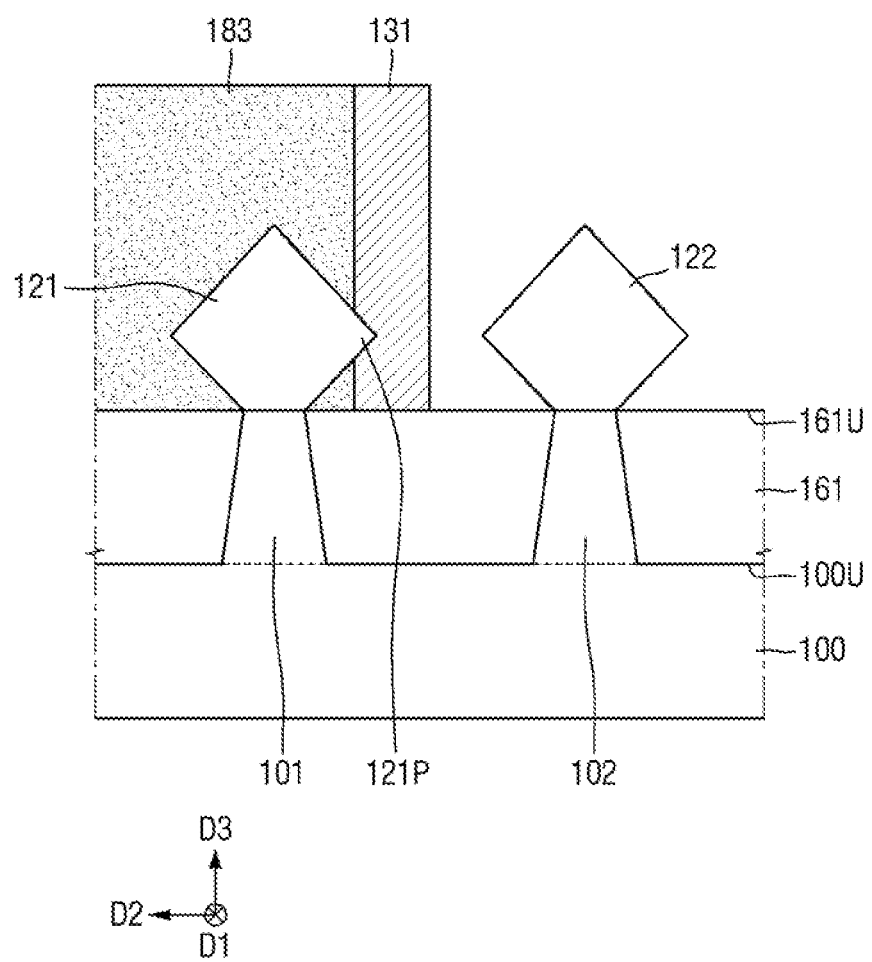

Referring to FIG. 16, a second semiconductor pattern 122 may be formed.

For example, the second mask layer 183 may be formed to cover the first semiconductor pattern 121. The portion of the second free fin type pattern 102p protruding from the upper surface 161U of the field insulating film 161 is removed, and the second fin type pattern 102 may be formed. A second semiconductor pattern 122 may be formed on the second fin type pattern 102.

Figure 17:
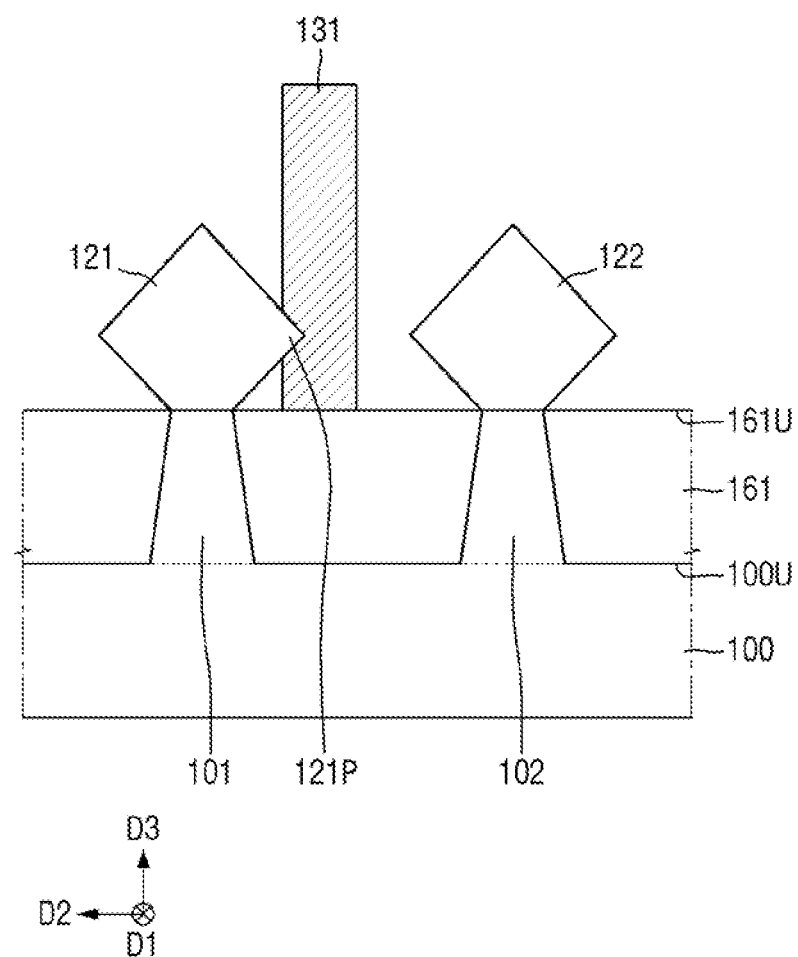

Referring to FIG. 17, the second mask layer 183 may be removed.

Referring to FIG. 2, an interlayer insulating film 163 may be formed on the upper surface of the field insulating film 161. The interlayer insulating film 163 may be formed to cover the first semiconductor pattern 121 and the second semiconductor pattern 122. The interlayer insulating film 163 may be formed to wrap the side surface of the first blocking pattern 131.

Hereinafter, the method for fabricating the semiconductor device according to some embodiments of the technical idea of the present inventive concept will be described with reference to FIGS. 5 and 18 to 22. For the sake of clarity of explanation, repeated parts of the aforementioned description will be omitted or simplified.

FIGS. 18 to 22 are intermediate step diagrams for explaining the method for fabricating the semiconductor device according to some embodiments of the technical idea of the present inventive concept.

Figure 18:
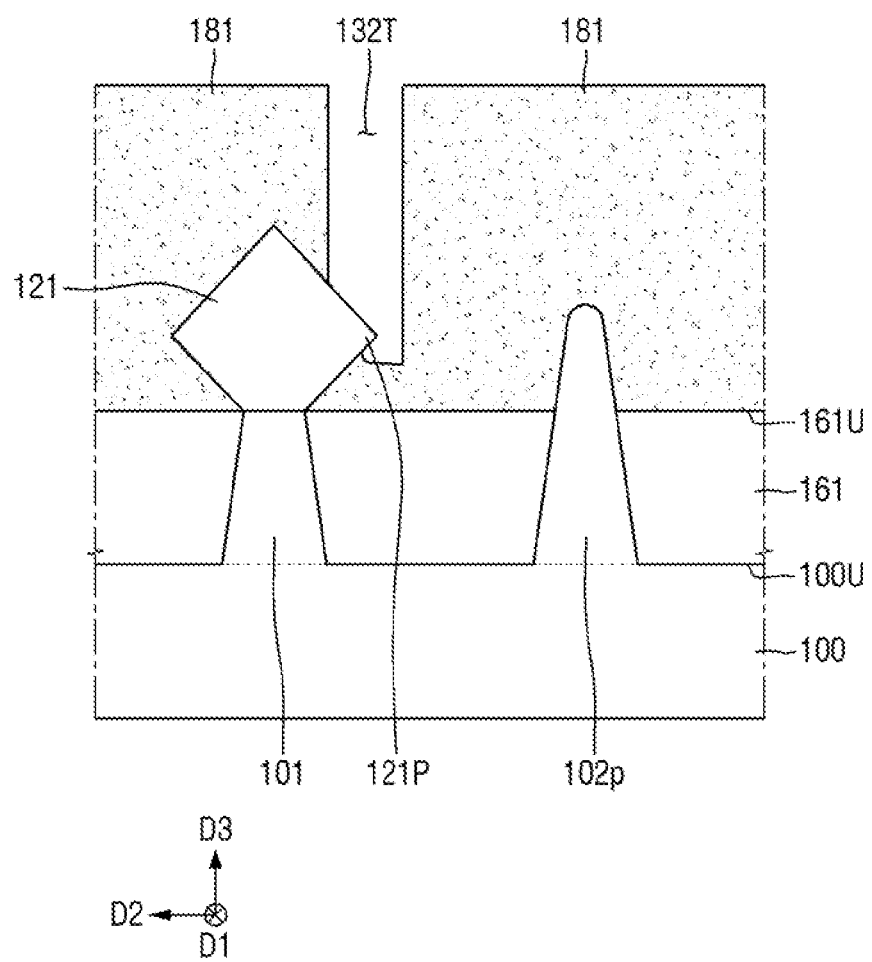
FIGS. 18 to 22 are intermediate step diagrams for explaining the method for fabricating the semiconductor device according to some embodiments of the technical idea of the present inventive concept.

Referring to FIG. 18, a part of the first mask layer 181 may be removed to form a second trench 132T. That is, the second trench 132T may be formed in the first mask layer 181. The second trench 132T may expose the first portion 121P of the first semiconductor pattern 121. The second trench 132T may not expose the upper surface 161U of the field insulating film 161.

Figure 19:
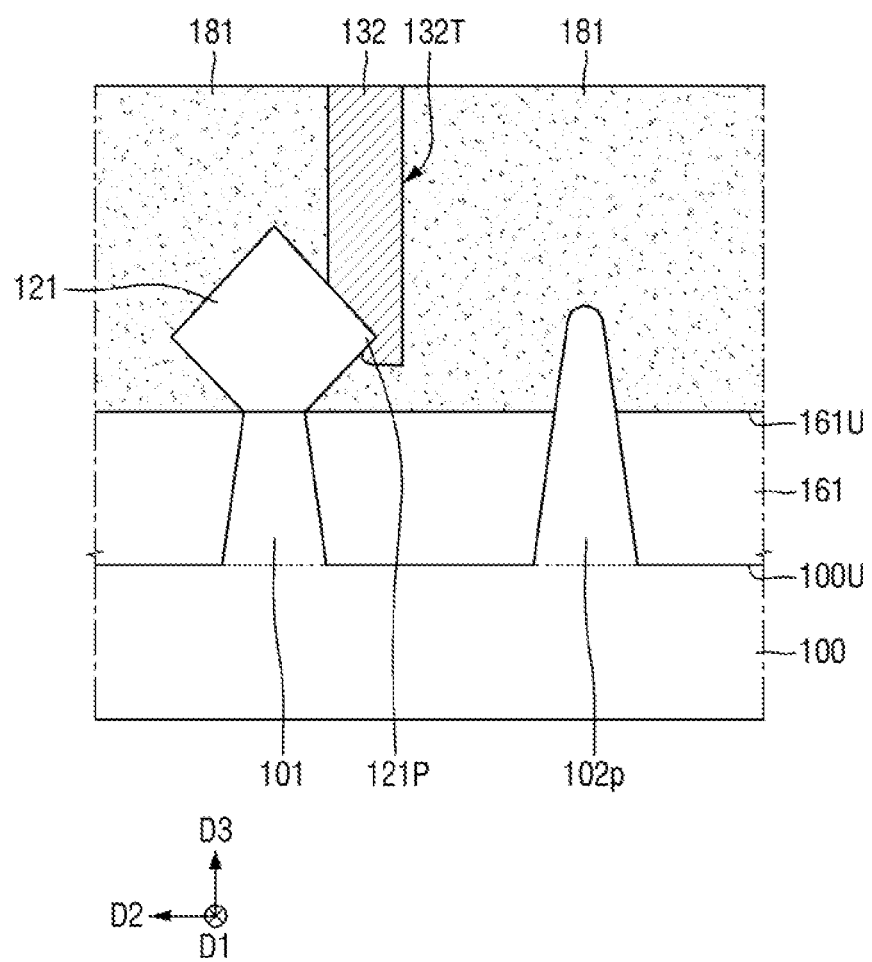

Referring to FIG. 19, the second blocking pattern 132 may be formed by filling the second trench 132T with a blocking pattern material. The blocking pattern material may wrap the first portion 121P of the first semiconductor pattern 121 exposed by the second trench 132T. As a result, the first portion 121P of the first semiconductor pattern 121 is inserted into the second blocking pattern 132 and may overlap the second blocking pattern 132 in the third direction D3.

In the fabricating process of the semiconductor device according to some embodiments of the technical idea of the present inventive concept, when the aspect ratio is high, after only a part of the first mask layer 181 is removed to form the second trench 132T, the second blocking pattern 132 may be formed.

Figure 20:
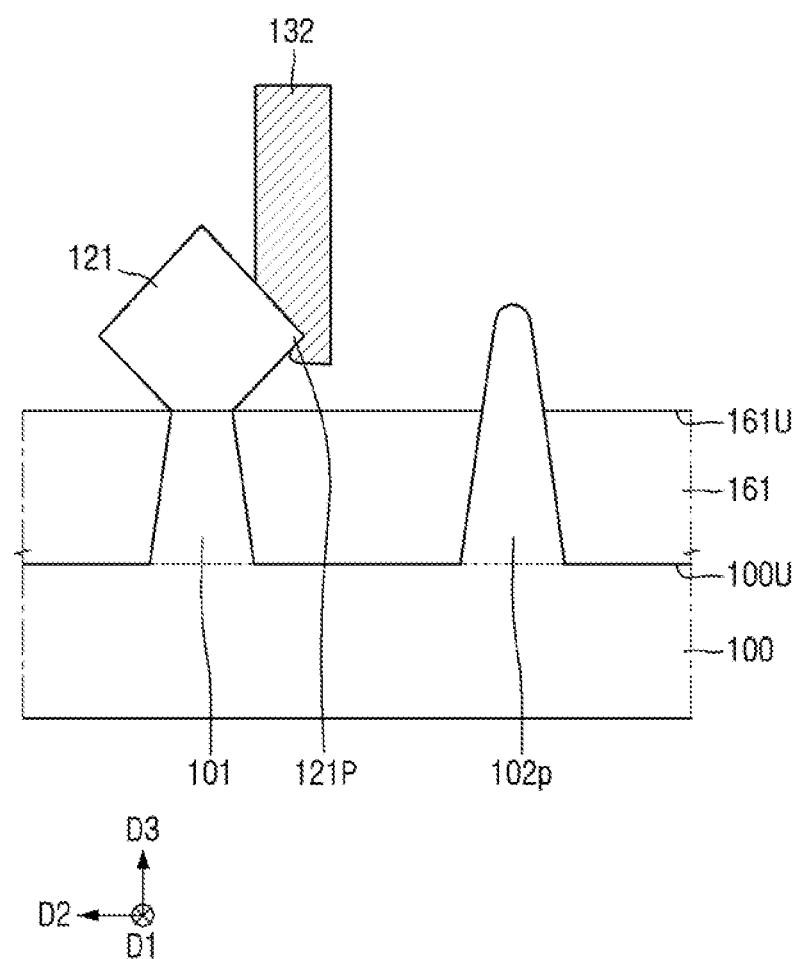

Referring to FIG. 20, the second mask layer 183 may be removed.

Figure 21:
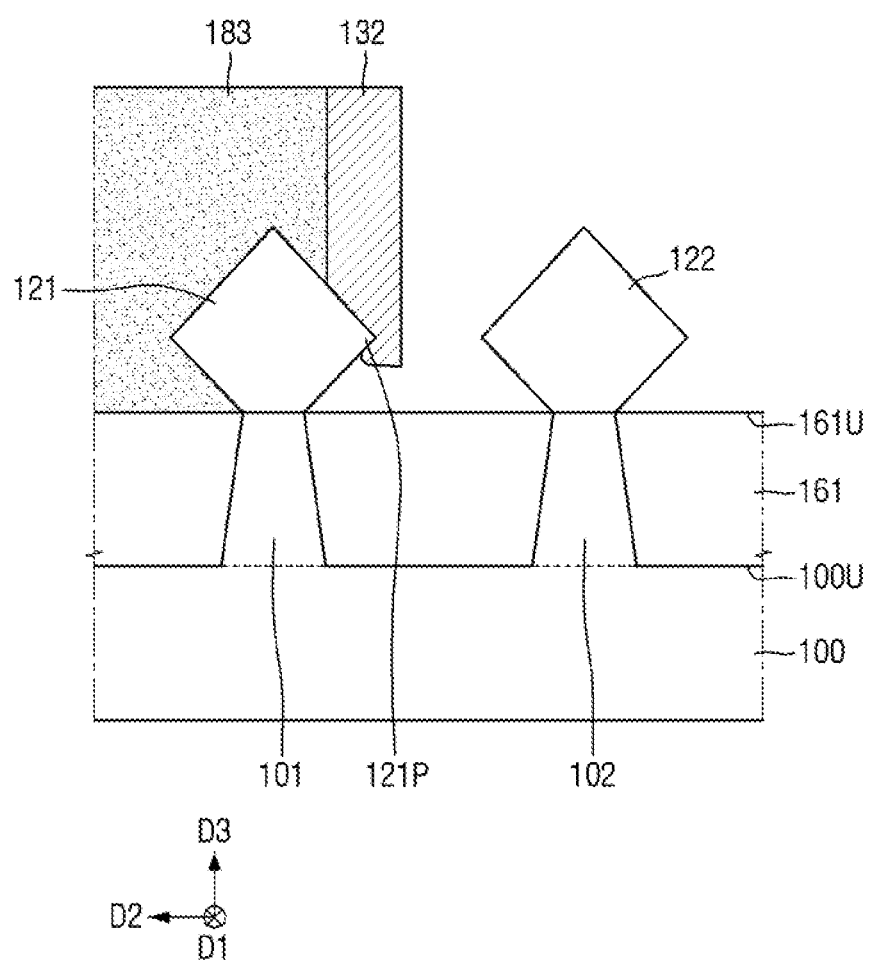

Referring to FIG. 21, a second mask layer 183 may be formed to cover the first semiconductor pattern 121, and a second semiconductor pattern 122 may be formed.

Figure 22:
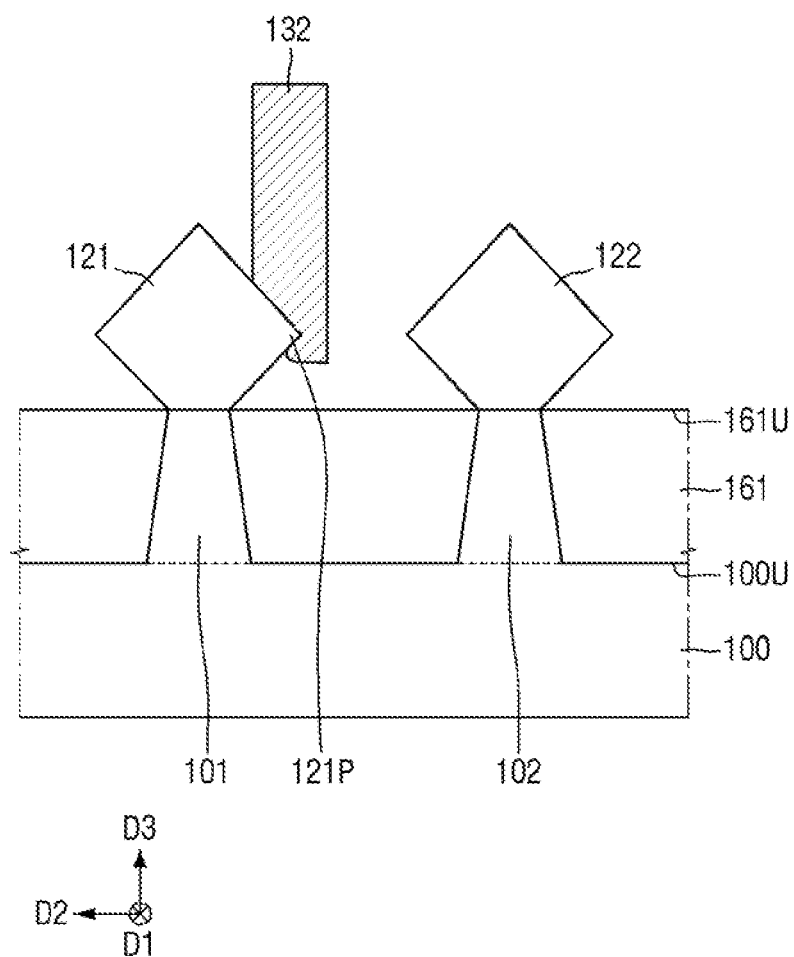

Referring to FIG. 22, the second mask layer 183 may be removed.

Referring to FIG. 5, an interlayer insulating film 163 may be formed on the upper surface of the field insulating film 161. The interlayer insulating film 163 may be formed to wrap the side surface of the second blocking pattern 132. The interlayer insulating film 163 may be formed between the upper surface 161U of the field insulating film 161 and the first semiconductor pattern 121. The interlayer insulating film 163 may be formed between the upper surface 161U of the field insulating film 161 and the second blocking pattern 132.

In the drawings, a method for fabricating a fin type transistor (FinFET) including a channel region of a fin type pattern shape is exemplarily illustrated, but the present inventive concept is not limited thereto. According to some embodiments of the present inventive concept, it is a matter of course that the method for fabricating the semiconductor device may also be used in a method for fabricating a planar transistor, a tunneling transistor (FET), a transistor including a nanowire, a transistor including a nanosheet or a three-dimensional (3D) transistor. In addition, the method for fabricating the semiconductor device according to some embodiments of the present inventive concept may be used in a method for fabricating a bipolar junction transistor, a lateral double diffused transistor (LDMOS) and the like.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the invention.

What is claimed is:

1. A semiconductor device comprising:
    a substrate;
    a first fin type pattern and a second fin type pattern which protrude from an upper surface of the substrate and are spaced apart from each other;
    a first semiconductor pattern on the first fin type pattern;
    a second semiconductor pattern on the second fin type pattern;
    a blocking pattern between the first semiconductor pattern and the second semiconductor pattern,
    a part of the first semiconductor pattern being inserted in the blocking pattern;
    a field insulating film which wraps at least a part of each of the first fin type pattern and the second fin type pattern, on the substrate; and
    an interlayer insulating film which is disposed on the field insulating film and covers the first semiconductor pattern and the second semiconductor pattern,
    wherein blocking pattern is disposed in the interlayer insulating film and extends to an upper surface of the field insulating film.

2. The semiconductor device of claim 1, wherein the first fin type pattern and the second fin type pattern extend in a first direction,
    the semiconductor device further comprising:
    a first gate structure extending in a second direction different from the first direction on the first fin type pattern; and a second gate structure extending in the second direction and spaced apart from the first gate structure on the second fin type pattern, the first semiconductor pattern is disposed on at least one side of the first gate structure, the second semiconductor pattern is disposed on at least one side of the second gate structure, and the blocking pattern extends along the first direction between the first gate structure and the second gate structure.

3. The semiconductor device of claim 2, wherein the blocking pattern is spaced apart from the second gate structure.

4. The semiconductor device of claim 2, wherein a part of the first gate structure is inserted into the blocking pattern, and the blocking pattern is in contact with the second gate structure.

5. The semiconductor device of claim 2, further comprising:

a first transistor including the first gate structure and the first semiconductor pattern, and a second transistor including the second gate structure and the second semiconductor pattern, wherein the first transistor and the second transistor are different types of transistors.

6. The semiconductor device of claim 2, further comprising:

a first transistor including the first gate structure and the first semiconductor pattern; and a second transistor including the second gate structure and the second semiconductor pattern, wherein the first transistor and the second transistor are the same type of transistor.

7. The semiconductor device of claim 2, wherein the first gate structure includes a first portion overlapping the first fin type pattern and a second portion overlapping the second fin type pattern, and a first transistor formed by the first portion of the first gate structure and the first semiconductor pattern is a type different from a second transistor formed by the second portion of the first gate structure and the second semiconductor pattern.

8. A semiconductor device comprising a first fin type pattern and a second fin type pattern which protrude to extend in a first direction and spaced apart from each other, on a substrate;

a first gate structure extending in a second direction different from the first direction on the first fin type pattern;

a first semiconductor pattern disposed on at least one side of the first gate structure and disposed on the first fin type pattern;

a second gate structure extending in the second direction and spaced apart from the first gate structure on the second fin type pattern;

a second semiconductor pattern disposed on at least one side of the second gate structure and disposed on the second fin type pattern; and a blocking pattern disposed between the first semiconductor pattern and the second semiconductor pattern and disposed between the first gate structure and the second gate structure, wherein a part of the first semiconductor pattern is inserted into the blocking pattern.

9. The semiconductor device of claim 8, wherein a part of the first gate structure is inserted into the blocking pattern, and the blocking pattern is in contact with the second gate structure.

10. The semiconductor device of claim 8, wherein the blocking pattern is spaced apart from the second gate structure.

11. The semiconductor device of claim 8, further comprising:

a field insulating film which wraps at least a part of each of the first fin type pattern and the second fin type pattern on the substrate; and an interlayer insulating film which is disposed on the field insulating film and covers the first semiconductor pattern and the second semiconductor pattern, wherein the blocking pattern is disposed in the interlayer insulating film and extends to an upper surface of the field insulating film.

12. The semiconductor device of claim 8, further comprising:

a field insulating film which covers at least a part of each of the first fin type pattern and the second fin type pattern on the substrate; and an interlayer insulating film which is disposed on the field insulating film and covers the first semiconductor pattern and the second semiconductor pattern, wherein the blocking pattern is disposed in the interlayer insulation film and disposed to be spaced apart from an upper surface of the field insulation film.

13. A semiconductor device comprising:

a first transistor including a first gate structure and a first semiconductor pattern disposed on at least one side of the first gate structure;

a second transistor including a second gate structure and a second semiconductor pattern disposed on at least one side of the second gate structure; and a blocking pattern between the first semiconductor pattern and the second semiconductor pattern, wherein a part of the first semiconductor pattern is inserted into the blocking pattern.

14. The semiconductor device of claim 13, wherein the blocking pattern further extends between the first gate structure and the second gate structure.

15. The semiconductor device of claim 13, further comprising:

first fin type patterns which extend in the first direction and are spaced apart from each other; and a field insulating film which wraps at least a part of the first fin type patterns, wherein the first gate structure extends in a second direction different from the first direction on the first fin type patterns, the first semiconductor pattern is disposed on the first fin type patterns, the blocking pattern extends in the first direction, and the blocking pattern is in contact with an upper surface of the field insulating film.

16. The semiconductor device of claim 13, further comprising:

first fin type patterns which extend in the first direction and are spaced apart from each other; and a field insulating film which wraps at least a part of the first fin type pattern, wherein the first gate structure extends in a second direction different from the first direction on the first fin type patterns, the first semiconductor pattern is disposed on the first fin type patterns,
the blocking pattern extends in the first direction, and
the blocking pattern is spaced apart from an upper surface of the field insulating film.

17. The semiconductor device of claim 13, wherein the first gate structure and the second gate structure are a single gate structure connected to each other, and
the first transistor and the second transistor are types different from each other.

* * * * *